United States Patent [19]

Barz et al.

[11] Patent Number: 5,099,396
[45] Date of Patent: Mar. 24, 1992

[54] ELECTRONIC CIRCUIT CONFIGURED FOR INDICATOR CASE

[75] Inventors: Herbert Barz, Flörsheim; Frank Langner, Rüsselsheim, both of Fed. Rep. of Germany

[73] Assignee: VDO Adolf Schindling AG, Frankfurt am Main, Fed. Rep. of Germany

[21] Appl. No.: 463,158

[22] Filed: Jan. 9, 1990

[30] Foreign Application Priority Data

Feb. 3, 1989 [DE] Fed. Rep. of Germany ....... 3903229

[51] Int. Cl.⁵ .............................. H05K 9/00
[52] U.S. Cl. .................... 361/424; 361/387; 361/394; 361/399; 361/412; 174/35 R
[58] Field of Search .......... 174/35 GC, 35 R, 35 MS, 174/250, 253, 255, 259, 261, 262, 51; 361/392, 393, 394, 395, 397, 399, 400, 406, 412, 419, 413, 424, 415, 386, 387, 388, 389, 390; 439/544, 545, 547, 548, 549, 552–557, 565–567, 572, 574–575

[56] References Cited

U.S. PATENT DOCUMENTS 4,661,888 4/1987 Jewell et al. ................... 361/424

Primary Examiner—Leo P. Picard
Assistant Examiner—Donald A. Sparks
Attorney, Agent, or Firm—Martin A. Farber

[57] ABSTRACT

A electronic circuit for an automobile, in particular in an instrument cluster, is disclosed. The electronic circuit comprises a computer having at least one microprocessor and application-specific integrated circuits and it is arranged in a shielding housing for suppression of electromagnetic interference. For improved removal of heat and high-frequency decoupling, surface areas of the external shielding are electrically and mechanically closely coupled to corresponding surface areas on the conducting path and, in addition, the incoming and outgoing lines which are subject to interference are protected by suitable filters.

11 Claims, 5 Drawing Sheets

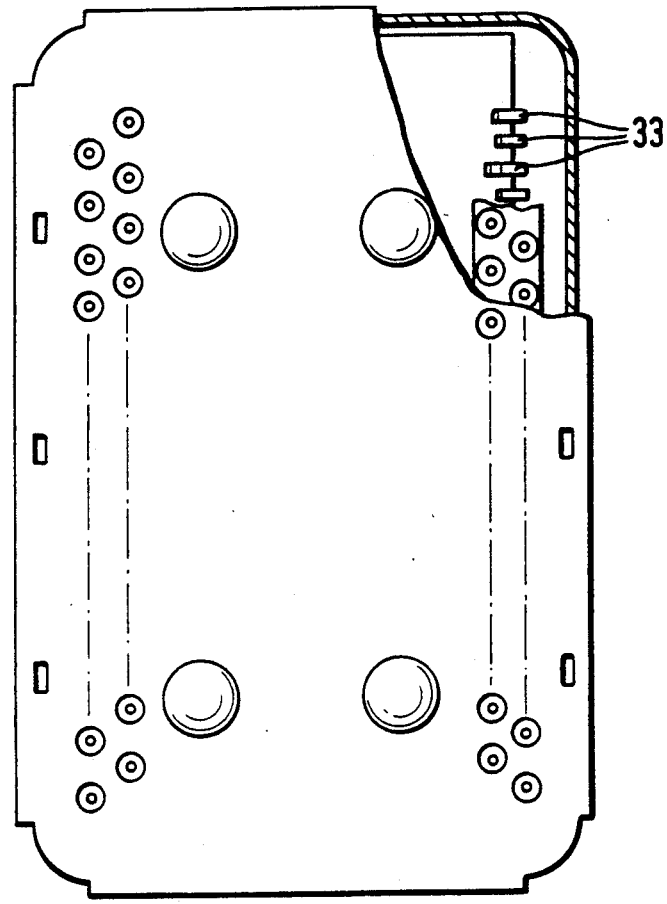
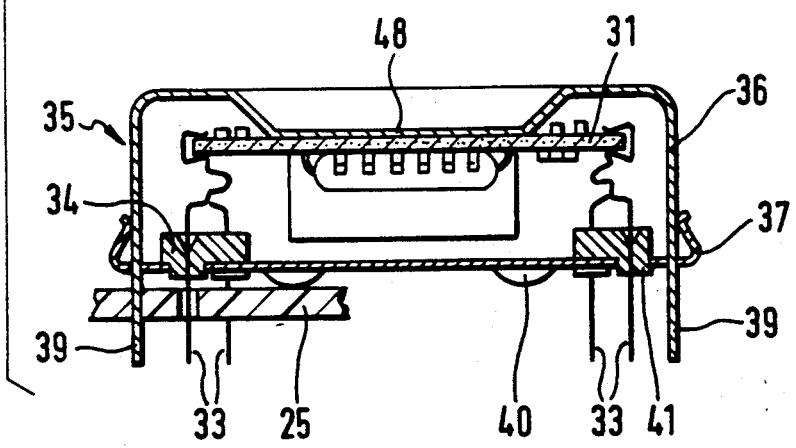
Fig. 4

ELECTRONIC CIRCUIT CONFIGURED FOR INDICATOR CASE

FIELD AND BACKGROUND OF THE INVENTION

The present invention relates to an electronic circuit in a motor vehicle, in particular in an instrument cluster in which various indicating instruments, indicating fields, monitoring and warning lights and possibly operating parts as well as electrical and electronic parts are arranged in a common housing and covered by a common transparent pane.

Such instrument clusters have been known for a long time, for instance from Federal Republic of Germany AS 16 05 947, and are used instead of the previously customary individual instruments in order to monitor various functions of an automobile.

Electrically controlled displays are increasingly used in such instrument clusters which, in addition to greater freedom of design, make a more intelligent and thus more precise and meaningful indication possible. The control is effected in general with the use of microprocessors or highly integrated, application-specific circuits. The digital pulse trains processed therein have very steep flanks and contain high-frequency portions up into the VHF-range, thus constituting a source of radio interference which makes radio reception or radio communication difficult when the motor vehicle is in operation. Such circuits can be affected furthermore by high-frequency radiation from the outside.

It has already been proposed (German patent application No. P 37 36 761.7) to provide a display computer and locate it on the common printed-circuit board in a housing which insulates from high-frequencies.

From Federal Republic of Germany OS 35 15 910 there is known, a high-frequency-proof housing with connecting pieces which serves to shield high-frequency parts, but the subject matter deals with a tap or distributor for cable television systems with a network of coaxial cables.

SUMMARY OF THE INVENTION

It is an object of the present invention further to develop an electronic circuit for an instrument cluster in such a manner that the effects of both line-related and non-line-related interference are counteracted and that the wireless propagation of outgoing radio-frequency interferences is reduced.

It is another object of the invention that the required depth of installation of the electronic circuit be kept as small as possible, that its structural dimensions be kept small and that the mounting be simplified. In this connection, the electromagnetic compatibility is to be improved and dissipated heat which occurs is to be led off well to the environment. At the same time, the reliability of operation is to be increased and, in particular, the heat removal is to be improved in view of the close arrangement of the heat-generating components. Finally, it is to be possible to produce the electronic circuit, and thus the instrument cluster as a whole, in a simple and inexpensive manner.

According to the invention there is provided an electronic circuit for an instrument cluster in a motor vehicle, the circuit being constructed with at least one ceramic substrate provided with component parts in a shielding housing. In addition, the invention provides that a part of the surface (32) of the ceramic substrate (e.g. 31, 63) is kept free of components and can be brought into areal contact with a substantially congruent surface (48) which is recessed in an outer surface of the shielding housing (35).

It is advantageous in this connection that the invention measures extend only over a part of the instrument cluster and therefore entail only slight expense. It is furthermore advantageous that the previous construction of an instrument cluster need not be fundamentally changed. It is also advantageous that the electromagnetic compatibility be improved. It is finally advantageous that the lost heat which occurs is led away well to the environment.

According to a feature of the invention, the areal contact takes place with the interposition of an adhesive which is a good electrical conductor.

Still further according to the invention, the areal contact takes place with the interposition of an adhesive which is a good conductor of heat.

Further according to the invention, the connecting of ground to highly integrated circuits (70) which are to be arranged on the ceramic substrate (31, 63) takes place via feed-through connectors (69).

Still according to another feature of the invention, contact springs (33) are provided for holding and for electrical connection of the ceramic substrate (31, 63), end regions of which contact springs surround an edge contact of the substrate in U-shape or omega-shape. The springs are curved over their free length in the shape of an S and are alternately shaped differently so that their ends on the printed-circuit board side in each case form two rows which are arranged in parallel to each other.

Yet the invention further provides that the contact springs (33) are mounted in cleats (41) consisting of an insulating material.

Still further according to the invention, the shielding is provided on several places of its circumference and in an extension of its side walls with projections (39, 68). The projections extend through the cover (37) and the printed-circuit board (25) of the instrument cluster, and have free ends which are connected with good electrical conduction on a side of the printed-circuit board (25) facing away from the high-frequency-proof housing (35) to a ground connection or a ground surface of the surrounding circuit.

Another feature of the invention provides that the cover have at least three outward-facing bosses (40) in order to establish a distance of the cover surface from the printed-circuit board (25) of the instrument cluster.

Still according to another feature of the invention, a recessed surface (38, 62) is located on the side of the shielding housing (35) facing the supporting printed-circuit board (25).

BRIEF DESCRIPTION OF THE DRAWINGS

With the above and other objects and advantages in view, the present invention will become more clearly understood in connection with the detailed description of different embodiments, when considered with the accompanying drawings, of which:

FIG. 4 includes FIGS. 4a and 4b to show the electronic circuit of FIG. 3 in assembled 4a and 4b condition in partially cut away top view and in cross section;

FIG. 6 is a view of a second embodiment of the electronic circuit, shown in section.

DETAILED DESCRIPTION OF THE PREFERRED EMBODIMENTS

Figure 1:
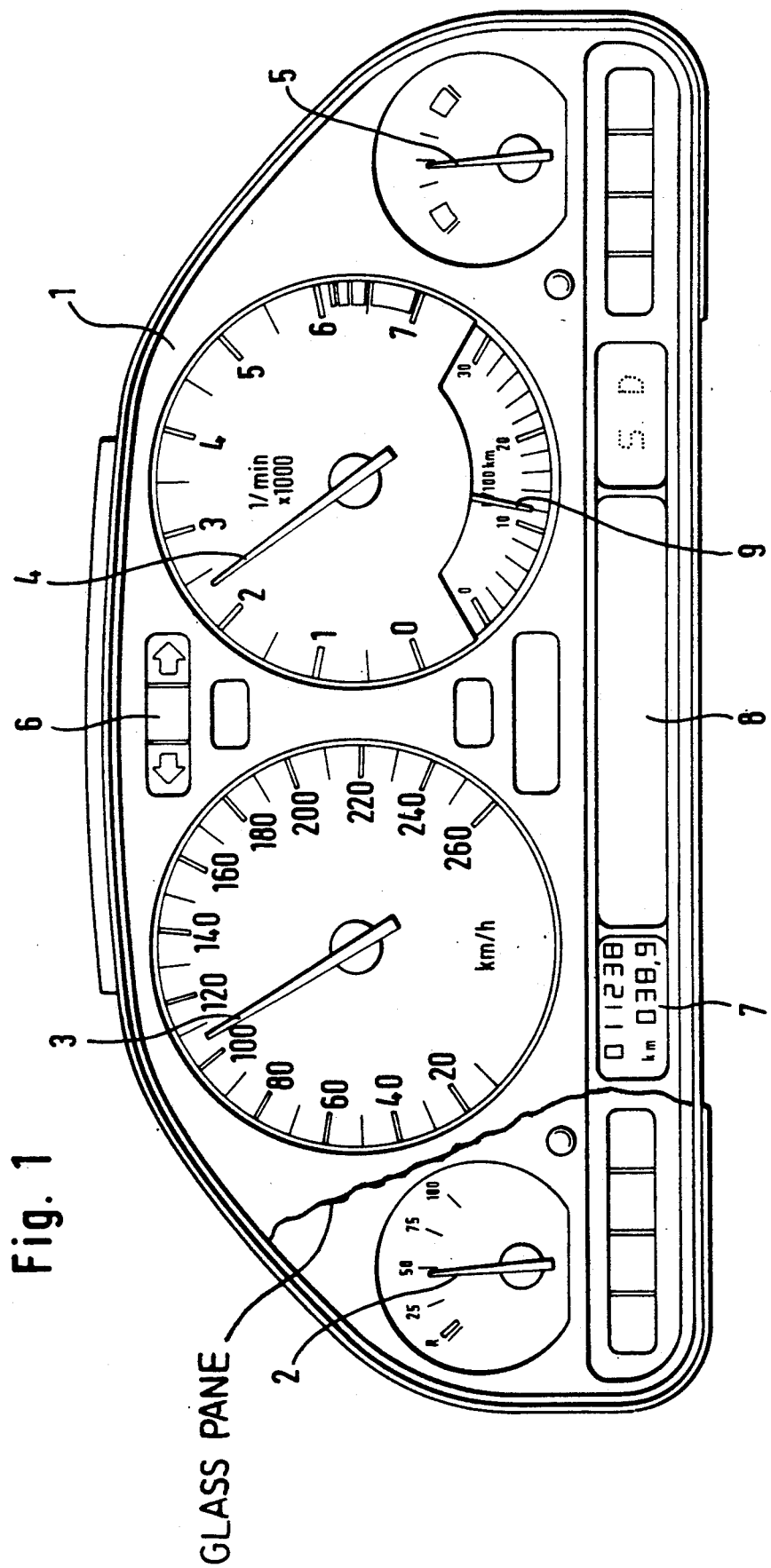
FIG. 1 is by way of example a front view of the instrument cluster containing the electronic circuit.

In FIG. 1, 1 is the front mask or pane of an instrument cluster which has, arranged alongside of each other in essentially the same plane, a fuel gauge 2, a speedometer 3, a tachometer 4 with integrated consumption indicator 9, and a cooling-water indicator 5. Furthermore there is provided a control lamp 6 for a turn indicator as well as a liquid-crystal display 7 for an electronic distance indicator, and a dot-matrix indicator 8 for various selective functions.

Figure 2:
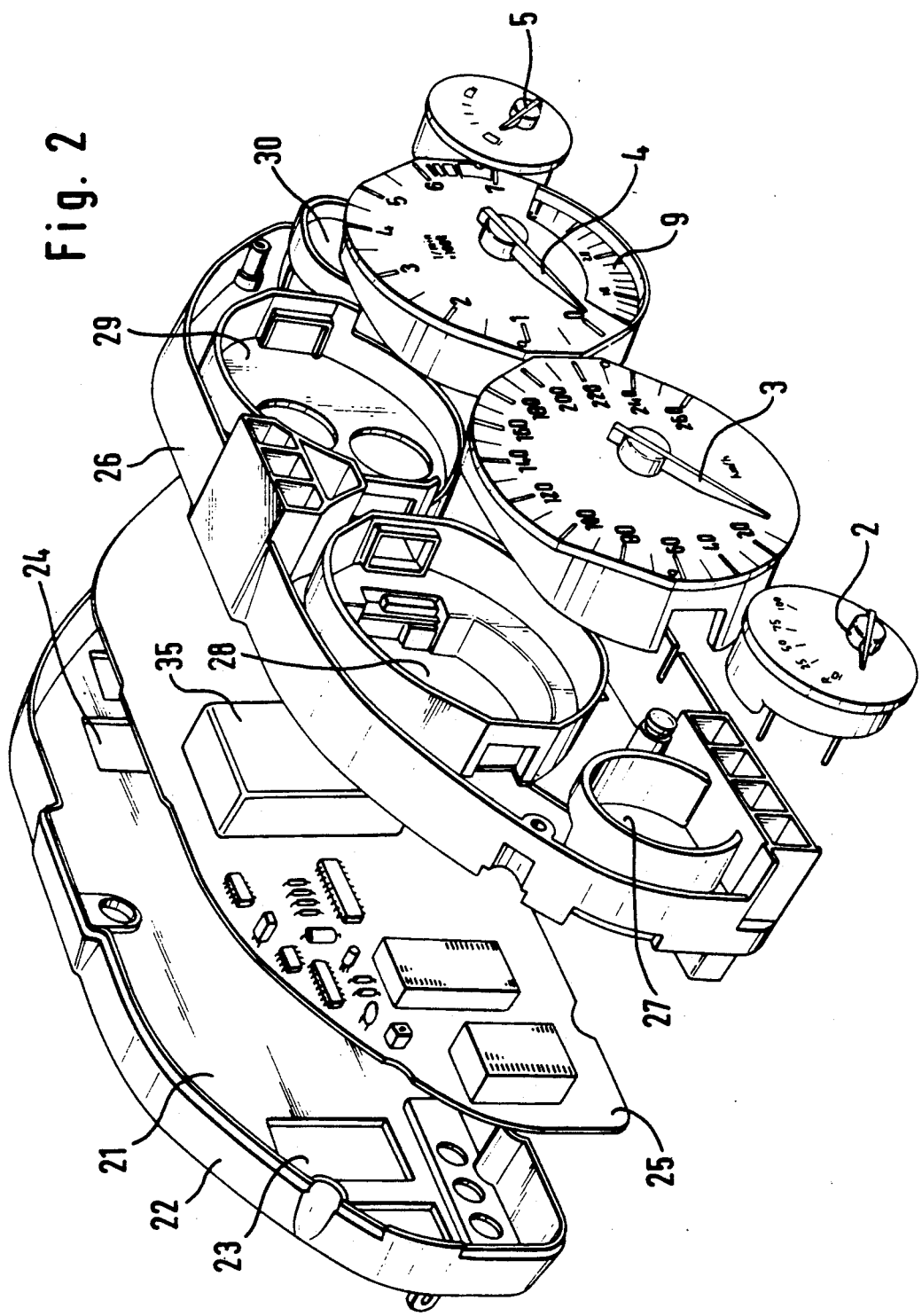
FIG. 2 is an exploded perspective view, without the front pane, of the same instrument cluster.

FIG. 2 shows the construction of the instrument cluster. It consists of a rear wall 21 with edge 22 formed thereon. The rear wall has a plurality of openings 23, 24 for receiving plug connections which serve for the electrical connecting of the instrument cluster to the corresponding sensors and external circuits, such as, for example, a circuit for activating the turn indicator.

A printed-circuit board 25 can be inserted into the rear wall 21, the board 25 containing all the active and passive circuit elements, conductor paths, plug connectors and terminals. The printed-circuit board 25 furthermore bears the computer required for the signal processing, which computer may consist, for instance, of two single-chip microcomputers and application-specific integrated circuits. This computer is located in a manner which will be described below, in a shielding housing 35 on the printed-circuit board 25.

A mounting plate 26 is provided in front of the printed-circuit board 25, which plate may be produced in the same manner as the rear wall 21, from a thermoplastic resin of suitable composition by an injection molding process. Together with the edge 22 of the rear wall 21, the mounting plate determines the external shape of the instrument cluster and has a plurality of openings 27, 28, 29, 30 for receiving the electromechanical indicator systems for the analog indicators 2 to 5 and 9. As components of the instrument cluster, these indicating systems can be replaced to a certain extent, depending on the equipment version of the vehicle, and connected correspondingly to the printed-circuit board 25. Thus, a clock can be installed and operated instead of the tachometer 4 with integrated fuel gauge 9. Likewise, electro-optical displays can be used for these indicating functions, with corresponding development and design of the components used for the instrument cluster.

As already stated hereinabove, the use of highly integrated electronics in an instrument cluster for motor vehicles requires special measures for shielding and suppression of interference in two directions. In this connection, the remaining electronic systems of the vehicle, in particular the radio receiver, are to be protected from interference by the instrument computer, and the computer is to be protected against interference from the outside. Furthermore, the depth of installation is to be increased only to the extent absolutely necessary. For this purpose, essentially only the computer and a few peripheral modules is shielded.

Figure 3:
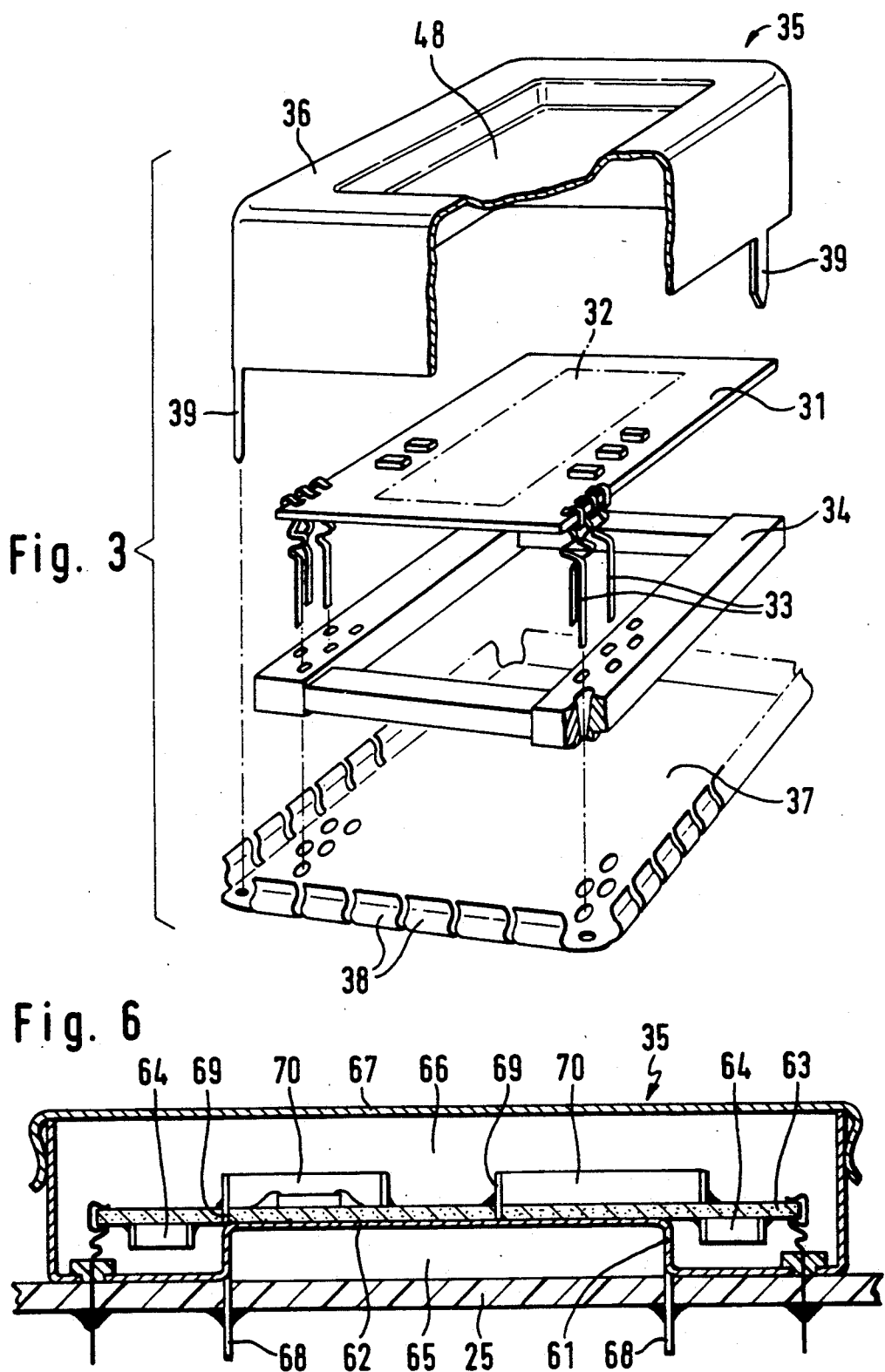
FIG. 3 shows a first embodiment of an electronic circuit in accordance with the invention, in exploded perspective view.
Figure 5:
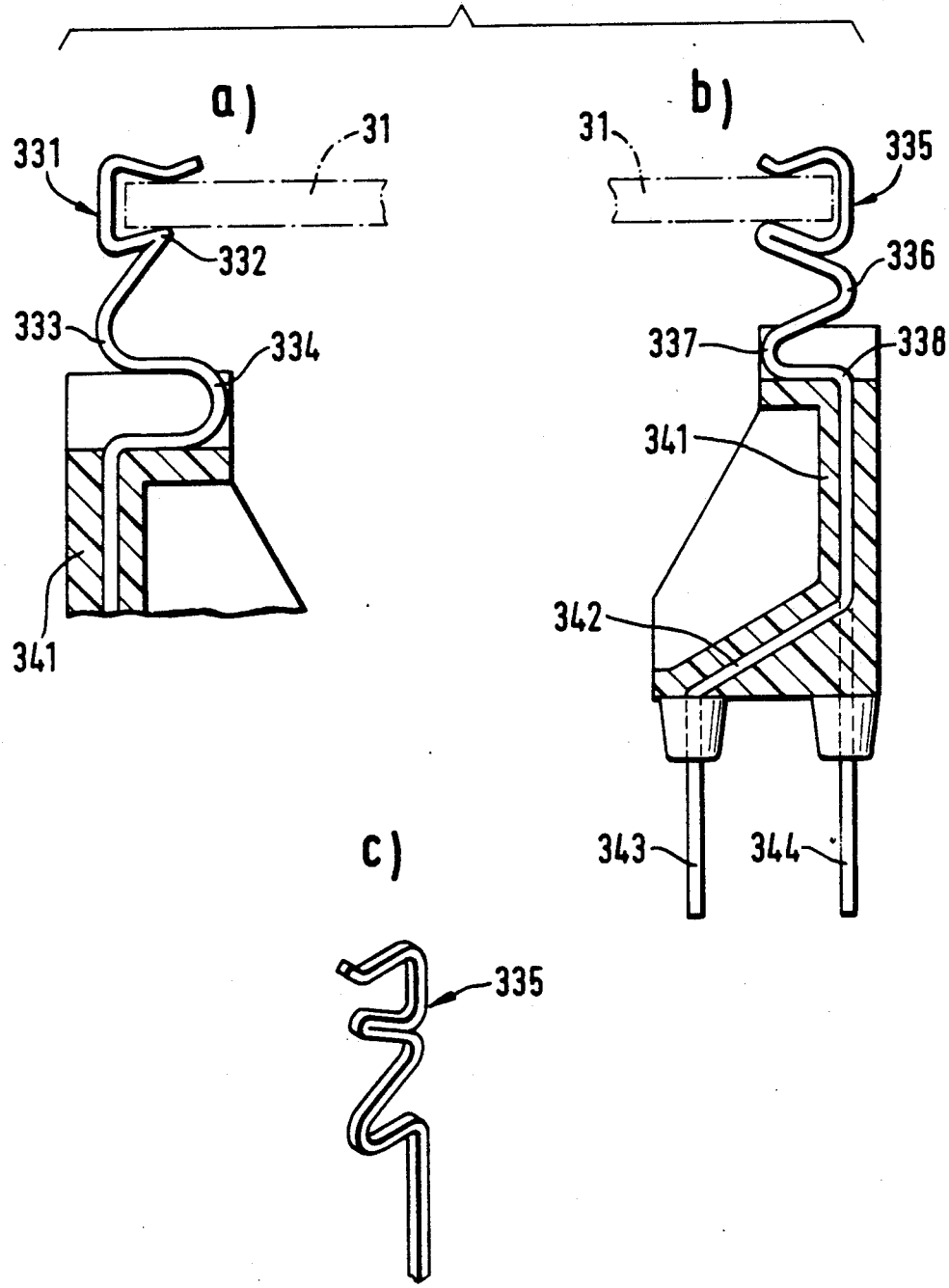
FIG. 5 includes FIGS. 5a, 5b and 5c which are cross-sectional and perspective views of details of the embodiment of FIGS. 3 and 4.

In accordance with a first embodiment of the invention, the computer is therefore located in a high-frequency-proof housing 35 on the printed-circuit board 25 as shown in FIGS. 3 to 5. For this purpose components of the computer are so arranged on a ceramic substrate 31 in the region of the substrate edge that a region 32 of the ceramic substrate 31 remains free of circuit elements. Contact springs 33 grip around the edge of the ceramic substrate 31 and are fastened there with good electric conductivity, as by connection soldering or cementing. The springs 33 are connected to end surfaces of conducting paths present thereon, and establish connections to the rest of the circuit. The contact springs 33 are of two different embodiments which alternate with each other so that the pins extend through a holding frame 34 in each case in two rows staggered with respect to each other, the distances between two contact springs of each row being twice the conducting-path spacing on the ceramic substrate 31.

the computer unit which has been completed in this manner is arranged in a shielding housing 35 which consists of the shielding can 36 and the cover 37. The cover 37 has on its edge resilient tongues 38 which grip over the edge of the shielding can 36 and connect the latter in electrically conductive manner to the cover 37. In order to improve the high-frequency shielding action, the resilient tongues 38 can be soldered to the shielding can 36.

The free surface 32 of the ceramic substrate 31 consitutes a ground surface which is advisedly coated prior to assembly with an adhesive of good electrical and thermal conductivity and which, after assembly, rests against the surface 48 of the through-like depression on the bottom of the shielding can 36. In this way, both the electrical shielding action and the removal of the lost heat are improved. Since no current loops are formed by currents flowing through the blocking capacitors, the development of electromagnetic fields with radiating effect on the outside is avoided. The shielding can 36 advisedly has projections 39 on several places on its circumference and along the extension of the side walls, which projections extend through the cover 37 and serve for electrical connection to the reference ground line (for instance, the negative terminal) on the printed-circuit board 25 by bending them after the insertion, establishing a predetermined spacing. It can be noted from FIG. 4b that a desired spacing of the cover 37 of the shielding device 35 from the printed-circuit board 25 is established by spacing bosses 40. The holder frame 34 forms on the bottom side, concentric to each contact spring 33, a projection 41 for insulating the contact springs 33 from the cover 37.

FIG. 5 shows various embodiments of the contact springs. The contact spring 331 of FIG. 5a surrounds the edge region of the ceramic substrate 31 in U-shape. A sharp-edged projection 332 on the bottom side results in this case in an extensive self-cleaning effect and thus promoting good contact with a conducting path provided on the ceramic substrate 31. The distance between the ceramic substrate 31 and a contact housing 341 which has been provided instead of the plastic frame 34 is bridged by the contact spring 333 in various arches 331 and 334. In this way, thermal expansion can be absorbed gently and excessive stresses by formation of cracks can be avoided.

The contact spring 335 surrounds the ceramic substrate 31 in similar manner, the contact spring having approximately the shape of the Greek capital letter omega. It continues in two arches 336, 337 which again serve to absorb thermal stresses. The contact spring 335 is then bent at a right angle at the place 338 and embedded in the plastic holder 341. As already mentioned above, two types of contact springs are advisedly provided alternately, one of which has a transition piece 342 which is the transition to the adjacent row of contacts. In this way, substantially more contacts can be provided, staggered with respect to each other and then contacted, than would be the case with merely a single-row arrangement of the free ends 343, 344 of the contact springs. In FIG. 5c, the contact spring 335 is shown again detached from the surrounding components. It can be noted therefrom that the contact spring 335 can be produced in simple manner from a semifinished product consisting of a suitable material, for instance copper-beryllium wire.

In the embodiment shown in FIG. 6, the bottom 61 of the shielding housing is recessed instead of the cover. As can be noted thereby from the cross-sectional showing, there is formed thereby a surface 62 which the ceramic substrate 63 of the computer adjoins with contact over a large area. The side of the ceramic substrate 63 facing the bottom is kept free of components in the surface in which it contacts the surface 62, while numerous blocking capacitors 64 are arranged in the edge region of the ceramic substrate 63. The integrated circuits 70 arranged on the top side of the ceramic substrate 63 are provided with ground lines via feed-through connectors 69. In this way, disturbing current loops are avoided.

In order to improve the electrical conduction and/or the heat transfer from the ceramic substrate 63 to the surface 62, the printed-circuit board is provided with a ground surface approximately congruent to the surface 62. The latter simultaneously represents the ground neutral point. As in the case of the first embodiment described above, the contacting of the surfaces can take place with the interposition of a layer of an adhesive of good electrical and/or thermal conductivity.

The construction of the shielding housing of FIG. 6 has the great advantage that the free space 65 on the printed-circuit board 25 of the instrument cluster below the raised surface 62 can be used for arrangement of additional components. Furthermore, the finished computer can be encapsulated in simple manner as protection against external influences and accelerations. In this case, the space 66 is filled with potting compound. The shielding housing 35 can then be closed without difficulty by the cover 67.

In addition, the mechanical attachment and the ground connection of the shielding housing 35 to the printed-circuit board 25 can be achieved in particularly simple manner by bending individual tongues 68 upward out of the bottom 61 and soldering them to the printed-circuit board 25.

We claim:

1. In an electronic circuit in a motor vehicle suitable for an instrument cluster comprising various indicating instruments, indicating fields, and lights arranged in a common housing and covered by a common transparent pane, the electronic circuit being formed in a structure comprising:
    at least one ceramic substrate, said circuit including component parts disposed on the substrate and outside a central portion of the substrate;
    a printed circuit board spaced-apart from said substrate and being adapted for electrical connection with an instrument cluster;
    a shielding housing mounted on said printed circuit board and enclosing said component parts; and wherein
    said shielding housing has an outer surface with a recessed central portion;
    a central portion of a surface of said ceramic substrate is free of component parts of the circuit, and contacts by areal contact with a substantially congruent surface of said recessed portion of the outer surface of said shielding housing for cooling said ceramic substrate and said circuit.

2. A circuit structure according to claim 1, wherein said areal contact takes place by an interposition of an adhesive, said adhesive being disposed at an interface between said substrate surface part and the surface of said recessed portion of the housing.

3. A circuit structure according to claim 2, wherein said adhesive being electrically conductive.

4. A circuit structure according to claim 3, wherein said adhesive being thermally conductive.

5. A circuit structure according to claim 2, wherein said adhesive being therally conductive.

6. A circuit structure according to claim 1, further comprising
    feed through connectors disposed on said ceramic substrate,
    said circuit component parts being integrated circuits; and
    wherein a connecting of ground to the integrated circuits takes place via said feed-through connectors.

7. In an electronic circuit in a motor vehicle suitable for an instrument cluster comprising various indicating instruments, indicating fields, and lights arranged in a common housing and covered by a common transparent pane, a circuit structure enclosing the electronic circuit, the circuit structure comprising:
    at least one ceramic substrate, said circuit including component parts disposed on the substrate;
    a shielding housing enclosing said component parts; and wherein
    said shielding housing has an outer surface with a recessed portion;
    a part of a surface of said ceramic substrate is free of component parts for contacting by areal contact with a substantially congruent surface of said recessed portion of the outer surface of said shielding housing;
    the circuit structure further comprises
    a printed circuit board spaced-apart from said substrate and being adapted for electrical connection with an instrument cluster; and
    contact springs for holding said substrate in a predetermined position relative to said board and for providing electrical connection with said component parts on said substrate; an end region of each of said contact springs surrounding an edge contact of said substrate in U-shape or omega-shape and wherein
    the springs are curved over their free length in the shape of an S, alternate ones of the springs being shaped differently so that ends of the springs on the printed-circuit board side in each case form two rows which are arranged in parallel to each other.

8. A circuit structure according to claim 7, wherein said shielding housing comprises
   a frame made of an insulating material, said springs being mounted in said frame.

9. In an electronic circuit in a motor vehicle suitable for an instrument cluster comprising various indicating instruments, indicating fields, and lights arranged in a common housing and covered by a common transparent pane, a circuit structure enclosing the electronic circuit, the circuit structure comprising:
   at least one ceramic substrate, said circuit including component parts disposed on the substrate;
   a shielding housing enclosing said component parts; and wherein
   said shielding housing has an outer surface with a recessed portion;
   a part of a surface of said ceramic substrate is free of component parts for contacting by areal contact with a substantially congruent surface of said recessed portion of the outer surface of said shielding housing;
   the circuit structure further comprises
   a printed circuit board spaced-apart from said substrate and being adapted for electrical connection with an instrument cluster; and wherein said shielding housing comprises
   a shielding can with a cover, said housing shielding against high frequency electromagnetic radiation; and wherein
   said shielding can includes projections extending from the sidewalls of the can at a plurality of locations along its circumference, said projections extending through the cover and the printed-circuit board, the free ends of the projections being connected with good electrical conduction on the side of the printed-circuit board facing away from said housing to a ground connection or a ground surface of said circuit.

10. In an electronic circuit in a motor vehicle suitable for an instrument cluster comprising various indicating instruments, indicating fields, and lights arranged in a common housing and covered by a common transparent pane, a circuit structure enclosing the electronic circuit, the circuit structure comprising:
   at least one ceramic substrate, said circuit including component parts disposed on the substrate;
   a shielding housing enclosing said component parts; and wherein
   said shielding housing has an outer surface with a recessed portion;
   a part of a surface of said ceramic substrate is free of component parts for contacting by areal contact with a substantially congruent surface of said recessed portion of the outer surface of said shielding housing;
   the circuit structure further comprises
   a printed circuit board spaced-apart from said substrate and being adapted for electrical connection with an instrument cluster; and wherein said shielding housing comprises
   a shielding can with a cover, said housing shielding against high frequency electromagnetic radiation; and wherein
   the cover has at least three outward-facing bosses in order to establish a distance of a surface of the cover from the printed circuit board.

11. In an electronic circuit in a motor vehicle suitable for an instrument cluster comprising various indicating instruments, indicating fields, and lights arranged in a common housing and covered by a common transparent pane, a circuit structure enclosing the electronic circuit, the circuit structure comprising:
   at least one ceramic substrate, said circuit including component parts disposed on the substrate;
   a shielding housing enclosing said component parts; and wherein
   said shielding housing has an outer surface with a recessed portion;
   a part of a surface of said ceramic substrate is free of component parts for contacting by areal contact with a substantially congruent surface of said recessed portion of the outer surface of said shielding housing;
   the circuit structure further comprises
   a printed circuit board spaced-apart from said substrate and being adapted for electrical connection with an instrument cluster; and wherein
   said recessed portion of the housing outer surface is arranged on the side of the shielding housing facing the printed-circuit board.

* * * * *